United States Patent
Yagyu et al.

(10) Patent No.: US 10,927,458 B2
(45) Date of Patent: Feb. 23, 2021

(54) METHOD OF FORMING FILM

(71) Applicant: FLOSFIA INC., Kyoto (JP)

(72) Inventors: Shingo Yagyu, Kyoto (JP); Takahiro Sasaki, Kyoto (JP); Nobuaki Watanabe, Kyoto (JP); Takashi Shinohe, Kyoto (JP)

(73) Assignee: FLOSFIA INC., Kyoto (JP)

( * ) Notice: Subject to any disclaimer, the term of this patent is extended or adjusted under 35 U.S.C. 154(b) by 3 days.

(21) Appl. No.: 16/151,461

(22) Filed: Oct. 4, 2018

(65) Prior Publication Data

US 2019/0106785 A1   Apr. 11, 2019

(30) Foreign Application Priority Data

Oct. 7, 2017 (JP) .............................. JP2017-196464
Oct. 7, 2017 (JP) .............................. JP2017-196465

(51) Int. Cl.
*C23C 16/448* (2006.01)
*C23C 16/34* (2006.01)
*C23C 16/455* (2006.01)

(52) U.S. Cl.
CPC .......... *C23C 16/4486* (2013.01); *C23C 16/34* (2013.01); *C23C 16/4481* (2013.01); *C23C 16/455* (2013.01); *C23C 16/45559* (2013.01)

(58) Field of Classification Search
CPC . C23C 16/4481; C23C 16/4486; C23C 16/34; C23C 16/455
See application file for complete search history.

(56) References Cited

U.S. PATENT DOCUMENTS 5,102,620 A * 4/1992 Watson ................ B22D 23/003
                                                              164/46
5,254,359 A * 10/1993 Zurecki .................. H01R 43/12
                                                              219/76.14

(Continued)

FOREIGN PATENT DOCUMENTS

| JP | 2000-63901 | * | 2/2000 |
| JP | 2015-134717 |   | 7/2015 |
| WO | 2014/050793 |   | 4/2014 |

OTHER PUBLICATIONS

Yasuda, Keiji, et al., "Ultrasonic Atomization Amount for Different Frequencies". Japanese Journal of Applied Physics 50 (2011) 07HE23, pp. 1-5.*

(Continued)

*Primary Examiner* — Bret P Chen
(74) *Attorney, Agent, or Firm* — Wenderoth, Lind & Ponack, L.L.P.

(57) ABSTRACT

In a first aspect of a present inventive subject matter, a method of forming a film includes turning a raw material containing at least a first chemical element and a second chemical element into atomized droplets; carrying the atomized droplets containing at least the first chemical element and the second chemical element by use of a carrier gas onto an object; and causing a reaction of the atomized droplets to form a film containing at least the first chemical element and the second chemical element on the object. The first chemical element is selected from among elements of Group 14 and elements of Group 15 of the periodic table. The second chemical element is selected from among d-block elements, elements of Group 13 and elements of Group 14 of the periodic table and different from the first chemical element.

20 Claims, 2 Drawing Sheets

(56) References Cited

U.S. PATENT DOCUMENTS

| | | | | |
|---|---|---|---|---|
| 5,368,657 | A * | 11/1994 | Anderson | C22C 1/1042 |
| | | | | 148/316 |
| 5,584,929 | A * | 12/1996 | Kawase | C30B 11/00 |
| | | | | 117/11 |
| 6,045,864 | A * | 4/2000 | Lyons | B05D 1/60 |
| | | | | 427/255.23 |
| 6,176,930 | B1 * | 1/2001 | Koai | C23C 16/4486 |
| | | | | 118/715 |
| 7,025,874 | B2 * | 4/2006 | Chan | B01F 5/0212 |
| | | | | 208/146 |
| 8,511,583 | B2 * | 8/2013 | Liu | B05B 17/04 |
| | | | | 239/102.2 |
| 2006/0185591 | A1 * | 8/2006 | Muralidharan | C23C 16/342 |
| | | | | 118/715 |
| 2007/0075322 | A1 * | 4/2007 | Nakamura | H01L 27/1292 |
| | | | | 257/97 |
| 2008/0280058 | A1 * | 11/2008 | Krunks | H01L 21/02554 |
| | | | | 427/453 |
| 2008/0292810 | A1 * | 11/2008 | Anderson | C23C 16/4486 |
| | | | | 427/565 |
| 2009/0035449 | A1 * | 2/2009 | Chen | B05B 13/0228 |
| | | | | 427/2.25 |
| 2009/0226631 | A1 * | 9/2009 | Yamazaki | H05B 33/10 |
| | | | | 427/510 |
| 2010/0000673 | A1 * | 1/2010 | Masuda | C23C 16/02 |
| | | | | 156/280 |
| 2012/0070575 | A1 * | 3/2012 | Hagerty | C08F 2/005 |
| | | | | 427/236 |
| 2013/0260150 | A1 * | 10/2013 | Grivei | H01B 1/24 |
| | | | | 428/402 |
| 2015/0021671 | A1 | 1/2015 | Nagahisa et al. | |
| 2015/0129027 | A1 * | 5/2015 | Asad | H01L 23/564 |
| | | | | 136/256 |
| 2015/0194479 | A1 | 7/2015 | Kaneko et al. | |
| 2016/0060788 | A1 | 3/2016 | Oda et al. | |
| 2016/0068954 | A1 * | 3/2016 | Srinivasan | C23C 18/1291 |
| | | | | 438/503 |
| 2016/0158421 | A1 * | 6/2016 | Troxel | A61L 27/54 |
| | | | | 424/423 |
| 2016/0215391 | A1 | 7/2016 | Sasaki et al. | |
| 2019/0169447 | A1 * | 6/2019 | Katori | C09D 1/00 |
| 2019/0203351 | A1 * | 7/2019 | Katori | C23C 14/228 |

OTHER PUBLICATIONS

Nath, Chandra, et al., "Design and evaluation of an atomization-based cutting fluid spray system in turning of titanium alloy." Journal of Manufacturing Processes 14 (2012) 452-459.*

Forbes, Thomas P., et al., "Droplet charging regimes for ultrasonic atomization of a liquid electrolyte in an external electric field". Physics of Fluids 23, 012104 (2011).*

Yasuda, Keiji, et al., "Analysis of concentration characteristics in ultrasonic atomization by droplet diameter distribution". Ultrasonics Sonochemistry 12 (2005) pp. 37-41.*

Dobry, Dan E., et al., "A Model-Based Methodology for Spray-Drying Process Development". J Pharm Innov (2009) 4:133-142. DOI 10.1007/s12247-009-9064-4.*

Praxair Surface Technologies brochure, "Multilayer Titanium Nitride Coatings: Liquid Droplet Erosion Protection for Power Generation". 2013, 1 page.*

Kentaro Kaneko, "Growth and Physical Properties of Corundum-Structured Gallium Oxide Alloy Thin Films", Dissertation, Kyoto Univ., issued Mar. 2013, pp. 1-116, with English abstract.

Toshiyuki Kawaharamura, "Research of Mist CVD Method and Application to Growth of Zinc Oxide Thin Films", Dissertation, Kyoto Univ., Mar. 2008, pp. 1-173, with English abstract.

* cited by examiner

METHOD OF FORMING FILM

CROSS-REFERENCE TO RELATED APPLICATION

This application is a new U.S. patent application that claims priority benefit of Japanese patent applications No. 2017-196464 filed on Oct. 7, 2017 and No. 2017-196465 filed on Oct. 7, 2017, the disclosures of which are incorporated herein by reference in its entirety.

BACKGROUND OF THE INVENTION

Field of the Invention

The present disclosure relates to a method of forming a film. Also, the present disclosure relates to a method of forming a non-oxide film.

Description of the Related Art

As a background, non-oxide films showing specific characteristics, which are corrosion-resistance, abrasion resistance, protective-function for an object on which a non-oxide film is to be formed, and/or electrically insulative characteristic, for example, are expected to be used in various industrial materials, electronic parts and devices. Examples of the non-oxide film include a carbide film, a sulfide film, a boride film, a phosphide film, and a nitride film.

It is open to the public that a field effect transistor includes a silicon nitride film that is formed as an insulating film by use of plasma CVD process (for reference, see US2015/0021671A), and the plasma CVD process requires a vacuum system, which tends to increase manufacturing cost.

Also, it is open to the public that oxide films including a gallium oxide film, an iron oxide film, an indium oxide film and an oxide film of mixed crystal are formed by use of mist CVD method (for reference, see JP2015-134717, WO2014050793A1, and see NPL 1: Kentaro KANEKO, "Fabrication and physical properties of corundum-structured alloys based on gallium oxide", Dissertation, Kyoto Univ., issued in March 2013, summary and contents were open to the public on Jan. 31, 2014, for example).

Compared with the plasma CVD process, the mist CVD method has an advantage which does not require a vacuum system to form films, however, it has been difficult to obtain non-oxide films containing one or more oxidizable chemical elements with stable reproductivity by use of the mist CVD method.

SUMMARY OF THE INVENTION

In a first aspect of a present inventive subject matter, a method of forming a film includes turning a raw material containing at least a first chemical element and a second chemical element into atomized droplets. The first chemical element is selected from among elements of Group 14 and elements of Group 15 of the periodic table. The second chemical element is selected from among d-block elements, elements of Group 13, and elements of Group 14 of the periodic table. The second chemical element is different from the first chemical element. The method of forming the film further includes carrying the atomized droplets containing at least the first chemical element and the second chemical element by use of a carrier gas onto an object; and causing a reaction of the atomized droplets to form a film containing at least the first chemical element and the second chemical element on the object.

Also, in a second aspect of a present inventive subject matter, a method of forming a film includes turning a raw material containing at least a first chemical element and a second chemical element into atomized droplets. The first chemical element is selected from among elements of Group 14 and elements of Group 15 of the periodic table. The second chemical element is selected from among d-block elements and elements of Group 14 of the periodic table. The second chemical element is different from the first chemical element. The method of forming the film further includes carrying the atomized droplets containing at least the first chemical element and the second chemical element by use of a carrier gas onto an object; and causing a reaction of the atomized droplets to form a film containing at least the first chemical element and the second chemical element on the object.

According to an embodiment of a method of forming a film, the reaction of the atomized droplets is a thermal reaction of the atomized droplets under an inert gas atmosphere.

Also, according to an embodiment of a method of forming a film, the reaction of the atomized droplets is a thermal reaction of the atomized droplets under a reducing gas atmosphere.

Also, according to an embodiment of a method of forming a film, the raw material contains a compound containing the first chemical element and the second chemical element.

Furthermore, according to an embodiment of a method of forming a film, the raw material may be a raw material solution containing at least the first chemical element and the second chemical element.

Also, according to an embodiment of a method of forming a film, the first chemical element belongs to Group 15 of the periodic table.

According to an embodiment, the first chemical element is suggested to be nitrogen.

Also, it is suggested that the second chemical element is a d-block element that is a Period 4 element of the periodic table, according to an embodiment of a method of forming a film.

Furthermore, it is suggested that the second chemical element belongs to Group 14 of the periodic table, according to an embodiment of a method of forming a film.

Also, it is suggested that an atomic ratio of the first chemical element and the second chemical element in the raw material solution is in a range of 1:2 to 10:1.

Furthermore, it is suggested that the thermal reaction may be conducted at a temperature that is 500° C. or higher.

DETAILED DESCRIPTION OF EMBODIMENTS

Figure 1:
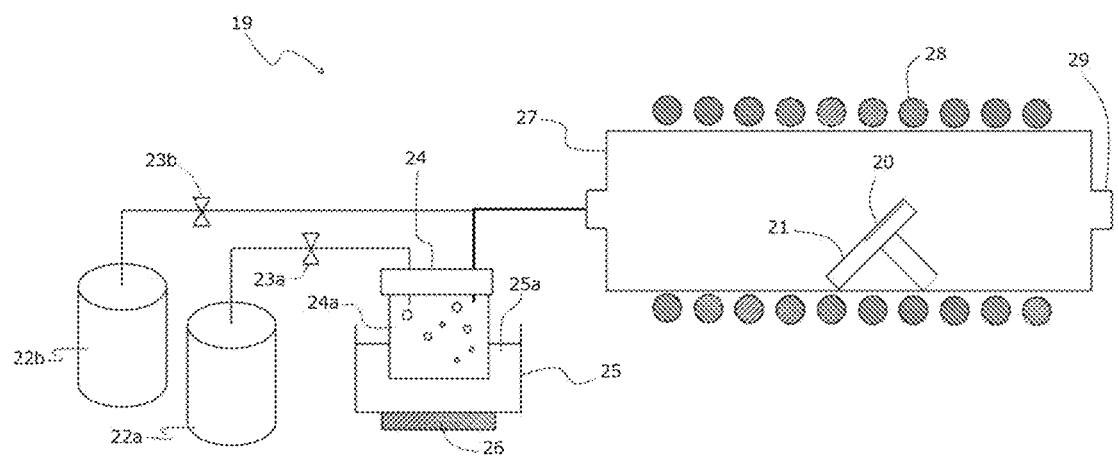
FIG. 1 shows a schematic view of a mist chemical vapor deposition (CVD) apparatus that is used in embodiments of a method for producing a semiconductor layer according to a present inventive subject matter.

The terminology used herein is for the purpose of describing particular embodiments only and is not intended to be limiting of the subject matter. As used herein, the singular forms "a", "an" and "the" are intended to include the plural forms as well, unless the context clearly indicates otherwise.

As used herein, the term "and/or" includes any and all combinations of one or more of the associated listed items.

As illustrated in the figures submitted herewith, some sizes of structures or portions may be exaggerated relative to other structures or portions for illustrative purposes. Relative terms such as "below" or "above" or "upper" or "lower" may be used herein to describe a relationship of one element, layer or region to another element, layer or region as illustrated in the figures. It will be understood that these terms are intended to encompass different orientations of a film, an object, and/or an apparatus in addition to the orientation depicted in the figures.

In a first aspect of a present inventive subject matter, a method of forming a film includes turning a raw material containing at least a first chemical element and a second chemical element into atomized droplets. The first chemical element is selected from among elements of Group 14 and elements of Group 15 of the periodic table. The second chemical element is selected from among d-block elements, elements of Group 13, and elements of Group 14 of the periodic table. The second chemical element is different from the first chemical element. The method of forming the film further includes carrying the atomized droplets containing at least the first chemical element and the second chemical element by use of a carrier gas onto an object; and causing a reaction of the atomized droplets to form a film containing at least the first chemical element and the second chemical element on the object.

Also, in a second aspect of a present inventive subject matter, a method of forming a film includes turning a raw material containing at least a first chemical element and a second chemical element into atomized droplets. The first chemical element is selected from among elements of Group 14 and elements of Group 15 of the periodic table. The second chemical element is selected from among d-block elements and elements of Group 14 of the periodic table. The second chemical element is different from the first chemical element. The method of forming the film further includes carrying the atomized droplets containing at least the first chemical element and the second chemical element by use of a carrier gas onto an object; and causing a reaction of the atomized droplets to form a film containing at least the first chemical element and the second chemical element on the object.

According to embodiments of a method of forming a film of a present inventive subject matter, it is possible to form a non-oxide film even containing one or more oxidizable chemical elements on various objects with stable reproductivity. Also, according to a method of a present inventive subject matter, it is possible to form a film uniformly on an object even including an uneven surface. Examples of an object on which a film is to be formed include a base including a substrate, an electronic part, an electronic product, and an industrial member.

(Base)

As a base, the base is not particularly limited as long as the base is able to support a film to be formed on the base. The base may be a known base. The base may be made of a material containing an organic compound. Also, the base may be made of a material containing an inorganic compound. Examples of the shape of the base include a plate shape, a circular plate shape, a shape of fiber, a shape of a stick, a shape of a round pillar, a shape of a square pillar, a shape of a tube, a shape of a spiral, a shape of a sphere and a shape of a ring.

According to an embodiment of a method of forming a film of a present inventive subject matter, the base may be a substrate.

Also, according to an embodiment of a method of forming a film of a present inventive subject matter, the object may include an uneven portion, because the method is suitable to form a film even on an uneven portion and/or an uneven surface. The object on which a film is to be formed may be perforated. The object may be porous. Also, according to an embodiment of a present inventive subject matter, a non-oxide film is formed on an object that is a three-dimensional object. The non-oxide film is formed without containing oxygen. Also, according to an embodiment of a method of forming a film, a non-oxide film containing a phosphide as a major component may be formed on an object. Furthermore, according to an embodiment of a method, a non-oxide film containing a nitride is formed on an object. According to an embodiment of a present inventive subject matter, a non-oxide film is able to be formed uniformly on an object including an uneven surface.

If an object is a substrate, the substrate is not particularly limited as long as the substrate is able to support a film which is formed on the substrate. The substrate may be an electrically-insulating substrate. Also, the substrate may be a semiconductor substrate. Furthermore, the substrate may be an electrically-conductive substrate.

The shape of the substrate may be, for example, a circular shape. The circular shape may include shapes of a circle, a semicircle and/or an ellipse. The shape of the substrate may be, for example, a polygonal shape. The polygonal shape may include a triangle, a square, a rectangle, a pentagon, a hexagon, a heptagon, an octagon and a nonagon. According to an embodiment of a present inventive subject matter, the shape of the substrate would be selectable to form a film in a desired shape on the substrate.

According to an embodiment of a present inventive subject matter, it is possible to obtain a film with a larger area by using the substrate with a larger area, on which the film is to be formed. Examples of the substrate include a substrate containing a corundum-structured crystal as a major component, a substrate containing a β-gallia-structured crystal as a major component, and a hexagonal-structured substrate. The term "major component" here means that a composition ratio of the crystal in the crystalline substrate is 50% or more, preferably 70% or more, and further preferably 90% or more.

Examples of the substrate containing a corundum-structured crystal as a major component include a sapphire ($\alpha$-$Al_2O_3$) substrate that includes a c-plane sapphire substrate, and an $\alpha$-phase gallium oxide ($\alpha$-$Ga_2O_3$) substrate. Examples of the substrate containing a β-gallia-structured crystal as a major component include β-phase gallium oxide (β-$Ga_2O_3$) substrate and a substrate containing a mixed crystal of $Ga_2O_3$ and $Al_2O_3$. As a substrate containing the mixed crystal of $Ga_2O_3$ and $Al_2O_3$, the substrate of the mixed crystal in which $Al_2O_3$ is contained in a range of more than 0 wt % to 60 wt % or less in terms of atomic ratio. Also, examples of the hexagonal-structured substrate include a silicon carbide (SiC) substrate, a zinc oxide (ZnO) substrate, a gallium nitride (GaN) substrate. Examples of a substrate with tetragonal crystal structure include a substrate with a (100) plane as a principal plane or a (200) plane as a principal plane. The thickness of the substrate is not particularly limited, however, is preferably in a range of 50 μm to 2000 μm. Furthermore, the thickness of the substrate is further preferably in a range of 200 μm to 800 μm, according to an embodiment of a method of forming a film of a present inventive subject matter.

(Raw Material)

The raw material is not particularly limited as long as the raw material contains at least a first chemical element and a second chemical element that is different from the first chemical element and the raw material is able to be turned into atomized droplets. According to embodiments of a method of forming a film of a present inventive subject matter, the raw material may be mixed in a solvent to be a raw material solution containing at least a first chemical element and a second chemical element. The amount of the raw material containing at least the first chemical element and the second chemical element contained in the raw material solution is not particularly limited as long as an object of the present inventive subject matter is not interfered with, however, is preferably 0.001 mol % to 50 mol %. The amount of metal contained in the raw material solution is further preferably 0.01 mol % to 50 mol %.

Also, the mixing ratio of the first chemical element and the second chemical element is not particularly limited, however, in embodiments of a method of forming a film of a present inventive subject matter, the first chemical element and the second chemical element are preferably mixed in a solvent such that the atomic ratio of the first chemical element and the second chemical element in the solvent should be in a range of 1:10 to 20:1. Furthermore, the atomic ratio of the first chemical element and the second chemical element in the solvent is further preferably in a range of 1:2 to 10:1, according to embodiments of a method of forming a film of a present inventive subject matter.

The first chemical element is not particularly limited as long as the first chemical element is selected from among elements of Group 14 and elements of Group 15 of the periodic table. The term "the periodic table" herein means the periodic table defined by the International Union of Pure and Applied Chemistry (IUPAC). Examples of elements of Group 14 include carbon (C), silicon (Si), germanium (Ge), tin (Sn) and lead (Pb). In embodiments of a method of forming a film of a present inventive subject matter, the element of Group 14 selected for the first chemical element is preferably carbon (C) or silicon (Si) to form a non-oxide film. The element of Group 14 selected for the first chemical element is further preferably silicon (Si) to form a non-oxide film in good quality, according to an embodiment of a present inventive subject matter. Also, examples of elements of Group 15 include nitrogen (N), phosphorus (P), arsenic (As), antimony (Sb), and bismuth (Bi). In embodiments of a method of forming a film of a present inventive subject matter, the element of Group 15 selected for the first chemical element is preferably nitrogen (N) or phosphorus (P). According to an embodiment of a present inventive subject matter, the element of Group 15 selected for the first chemical element is further preferably nitrogen (N).

The second chemical element is not particularly limited as long as the second chemical element is selected from among d-block elements and elements of Group 14 of the periodic table. Examples of d-block metal include scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), lutetium (Lu), hafnium (Hf), tantalum (Ta), tungsten (W), rhenium (Re), osmium (Os), iridium (Ir), platinum (Pt), gold (Au), mercury (Hg), lawrencium (Lr), rutherfordium (Rf), dubnium (Db), seaborgium (Sg), bohrium (Bh), hassium (Hs), meitnerium (Mt), darmstandtium (Ds), roentgenium (Rg) and copernicium (Cn). According to embodiments of a method of a present inventive subject matter, the element selected from d-block elements for the second chemical element is further preferably a d-block element of Period 4 of the periodic table to form a film containing at least the first chemical element and the second chemical element. Examples of the d-block element of Period 4 of the periodic table include scandium (Sc), titanium (Ti), vanadium (V), chromium (Cr), manganese (Mn), iron (Fe), cobalt (Co), nickel (Ni), copper (Cu), and zinc (Zn). According to an embodiment of a method of forming a film containing at least the first chemical element and the second chemical element, the second chemical element is preferably selected from d-block elements of Period 4 of the periodic table and elements of Group 14 of the periodic table. According to an embodiment of a present inventive subject matter, the second chemical element is further preferably selected from among the elements of Group 14 of the periodic table.

According to an embodiment of a method of forming a film of a present inventive subject matter, the method includes turning a raw material containing at least a first chemical element that is selected from among elements of Group 15 of the periodic table and a second chemical element that is selected from among the elements of Group 14 of the periodic table. This combination of the first chemical element and the second chemical element in the raw material tends to make the film hardly oxidizable. Also, this combination is expected to enhance corrosion resistance of a film to be obtained.

The raw material is required to contain at least a first chemical element and a second chemical element that is different from the first chemical element to obtain a film containing at least the first chemical element and the second chemical element. Accordingly, the raw material may contain a third chemical element or more chemical elements different from the first chemical element and the second chemical element.

Also, according to an embodiment of a method of forming a film of a present inventive subject matter, a raw material preferably contains a first chemical element and a second chemical element in the form of a compound to obtain a non-oxide film containing the first chemical element and the second chemical element as the compound.

Furthermore, according an embodiment of a method of forming a film of a present inventive subject matter, a raw material may contain a first compound containing a first chemical element and a second compound containing a second chemical element to obtain a non-oxide film.

The non-oxide film that is obtained according to embodiments of a present inventive subject matter preferably contains the first chemical element and the second chemical element as a major component. Also, the non-oxide film that is obtained according to embodiments of a present inventive subject matter further preferably contains a compound containing the first chemical element and the second chemical element as a major component.

The term "major component" here means that, if the film contains titanium nitride that is a compound of the first chemical element and the second chemical element as a major component, the atomic ratio of titanium and nitride to entire chemical elements in the film is 0.5 or more. Furthermore, the atomic ratio of the first chemical element and the second chemical element to entire chemical elements in the film is preferably 0.7 or more, and further preferably 0.8 or more.

The compound containing the first chemical element and the second chemical element is not particularly limited as long as the compound contains the first chemical element and the second chemical element that is different from the first chemical element. The compound may be an inorganic compound according to an embodiment. Also, the compound may be an organic compound, according to an embodiment.

Furthermore, the first compound containing the first chemical element is not particularly limited as long as the first compound contains the first chemical element. The first compound may be an inorganic compound according to an embodiment. Also, the first compound may be an organic compound according to an embodiment.

Also, the second compound containing the second chemical element is not particularly limited as long as the second compound contains the second chemical element. The second compound may be an inorganic compound according to an embodiment. Also, the second compound may be an organic compound according to an embodiment.

Furthermore, according to an embodiment of a method of forming a film of a present inventive subject matter, a raw material preferably contains nitrogen as a first chemical element, and a non-oxide film that is obtained contains a nitride of a second chemical element as a compound. This combination is preferable to obtain a non-oxide film that is a nitride film uniformly containing the first chemical element and the second chemical element.

Also, according to an embodiment of a method of forming a film of a present inventive subject matter, a raw material preferably contains phosphorus as a first chemical element, and a non-oxide film that is obtained contains a phosphide of a second chemical element as a compound. This combination is also preferable to obtain a non-oxide film that is a phosphide film in good quality.

A solvent of the raw material solution is not particularly limited, and thus, the solvent may be a known solvent. The solvent may be an inorganic solvent that includes water. Examples of water include pure water, ultrapure water, tap water, well water, mineral water, hot spring water, spring water, fresh water and ocean water. Also, the solvent may be an organic solvent. Examples of the organic solvent include alcohol and ethanol.

According to embodiments of a method of forming a non-oxide film of a present inventive subject matter, a solvent in a raw material solution is preferably an organic solvent, which is suitable to form a non-oxide film containing at least a first chemical element and a second chemical element. According to an embodiment of a method of forming a film of a present inventive subject matter, the solvent is further preferably an oxygen-free organic solvent. Examples of the oxygen-free organic solvent include a hydrocarbon-based solvent and an aromatic-based solvent. Examples of the hydrocarbon-based solvent include an aliphatic hydrocarbon solvent and an alicyclic hydrocarbon solvent. Examples of the aliphatic hydrocarbon solvent include hexane, heptane, octane, and decalin. Examples of the alicyclic hydrocarbon solvent include cyclohexane, and methylcyclohexane. Examples of the aromatic-based solvent include alkylbenzenes, alkylnaphthalenes, alkylbiphenyls, alkylanthracenes, and halogenated aromatics. Examples of alkylbenzenes include toluene, xylene, trimethylbenzene, ethylbenzene, and propylbenzene. Examples of alkylnaphthalenes include methylnaphthalene, ethylnaphthalene, and dimethylnaphthalene. Examples of halogenated aromatics include chlorobenzene, dichlorobenzene, and trichlorobenzene.

Also, according to an embodiment of a present inventive subject matter, a raw material solution may contain a dopant. It is possible to control electrical conductivity of a film by adding a dopant into a raw material solution even without ion implantation and/or braking a crystal structure of the film. Examples of n-type dopant include tin, germanium, silicon, titanium, zirconium, hafnium, vanadium and niobium. Examples of p-type dopant include magnesium, calcium, and zinc. The dopant concentration in general may be in a range of $1\times10^{16}/cm^3$ to $1\times10^{22}/cm^3$. The dopant concentration may be at a lower concentration of, for example, approximately $1\times10^{17}/cm^3$ or less. Also, the dopant concentration may be at a high concentration of, for example, $1\times10^{20}/cm^3$ or more.

(Forming Atomized Droplets)

A raw material solution is turned into atomized droplets floating in a space of a container of a mist generator. A raw material and/or a raw material solution may be turned into atomized particles and/or droplets by a known method, and the method is not particularly limited, however, according to an embodiment of a present inventive subject matter, the raw material solution is preferably turned into atomized droplets by ultrasonic vibration.

Atomized droplets obtained by using ultrasonic vibration, and floating in the space have the initial velocity that is zero. Since atomized droplets floating in the space are carriable as a gas, the atomized droplets floating in the space are preferable to avoid damage caused by the collision energy without being blown like a spray. The size of droplets is not limited to a particular size, and may be a few mm, however, the size of atomized droplets is preferably 50 μm or less. The size of droplets is preferably in a range of 0.1 μm to 10 μm.

(Carrying Atomized Droplets into a Film-Formation Chamber)

Atomized droplets floating in the space of a container for forming atomized droplets are carried into a film-formation chamber by a carrier gas. The carrier gas is not limited as long as an object of the present inventive subject matter is not interfered with, however, according to embodiments of a present inventive subject matter, examples of the carrier gas may be an inert gas such as nitrogen and argon or a reducing gas such as a hydrogen gas and a forming gas. One or more carrier gas of the examples may be used, and a dilution gas at a reduced flow rate (e.g., 10-fold dilution gas) may be used as a second carrier gas. Also, the carrier gas may be supplied from one or more locations. While the flow rate of the carrier gas is not particularly limited, the flow rate of the carrier gas may be in a range of 0.01 to 20 L/min. According to an embodiment of a present inventive subject matter, the flow rate of the carrier gas may be preferably in a range of 1 to 10 L/min. When a dilution gas is used, the flow rate of the dilution gas is preferably in a range of 0.001 to 10 L/min, and further preferably in a range of 0.1 to 10 L/min.

(Forming a Film)

For forming a film, the atomized droplets carried into the film-formation chamber by carrier gas are thermally reacted (through "thermal reaction") to form a semiconductor layer on a surface of a base. Herein, "thermal reaction" covers as long as the atomized droplets react by heat, and thus, the term "thermal reaction" herein may include a chemical reaction, and/or a physical reaction. The "thermal reaction" herein may include another reaction, and conditions of reaction are not particularly limited as long as an object of a present inventive subject matter is not interfered with. According to embodiments of a method of forming a film of a present inventive subject matter, the thermal reaction is required to be conducted under an inert gas atmosphere or under a reducing gas atmosphere. After the atmosphere in the film-formation chamber was sufficiently replaced with the carrier gas that is an inert gas or a reducing gas, the thermal reaction is conducted under the atmosphere of the carrier gas without being exposed to the air outside of the film-formation chamber.

In contrast, nitrogen has been used as a carrier gas to form a metal oxide film in a film-formation chamber by use of a mist chemical vapor deposition (CVD) method, however, the metal oxide film was formed under a condition that tends to be exposed to the air entering the film-formation chamber from outside of the film-formation chamber.

Accordingly, the thermal reaction conducted under the atmosphere of carrier gas that is an inert gas or a reducing gas without influence of oxygen is important to form a non-oxide film by use of a mist CVD method in embodiments of a method of forming a non-oxide film of a present inventive subject matter.

Furthermore, according to embodiments of a method of forming a film of a present inventive subject matter, the thermal reaction is conducted at an evaporation temperature or higher temperatures of the evaporation temperature of the solvent of the raw material solution. The thermal reaction in embodiments of a method of a present inventive subject matter is preferably conducted at a temperature that is 500° C. or higher. According to an embodiment of a method of forming a film of a present inventive subject matter, the thermal reaction may be further preferably conducted at a temperature that is 550° C. or higher. For example, if the first chemical element is nitrogen, the thermal reaction is preferably conducted at a temperature that is 750° C. or higher.

Also, the thermal reaction may be conducted under any atmospheric pressure and not particularly limited as long as the thermal reaction is conducted in an inert gas atmosphere or in a reducing gas atmosphere and as long as an object of the present inventive subject matter is not interfered with. Accordingly, the thermal reaction may be conducted under an atmospheric pressure, an increased pressure, or a reduced pressure, however, according to embodiments of a present inventive subject matter, the thermal reaction is preferably conducted under an atmospheric pressure in an inert gas atmosphere or in a reducing gas atmosphere. Also, the thickness of the semiconductor layer is able to be set by adjusting a film-formation time.

According to embodiments of the method of a present inventive subject matter, it is possible to obtain non-oxide films, which are available for various industrial products. Non-oxide films obtainable according to embodiments of a method of a present inventive subject matter are useful for industrial purposes. A non-oxide film that is obtained according to an embodiment of a present inventive subject matter may be used as it is in electronic parts, and devices, for example, and also may be used after a surface treatment is done on the non-oxide film. Examples of electronic parts include a hard material and a super hard material used for tools, dies, and/or molds. Examples of electronic devices include optical products, fuel cells, solar cells, vehicles, and industrial appliances.

Embodiments are explained in more details.

Practical Example 1

1. Film-Formation Apparatus

FIG. 1 shows a mist chemical vapor deposition (CVD) apparatus used in this example to form a film. The mist CVD apparatus 19 includes a mist generator 24 in that a raw material solution 24a is contained, a vessel 25 in that water 25a is contained, and an ultrasonic transducer that may be attached to a bottom surface of the vessel 25. The mist generator 24 is arranged in the water 25a of the vessel 25. The mist CVD apparatus 19 further includes a carrier gas supply device 22a, a flow-control valve 23a to control a flow of a carrier gas that is configured to be sent from the carrier gas supply device 22a to the mist generator 24, a diluted carrier gas supply device 22b, a flow-control valve 23b to control a flow of a carrier gas that is configured to be sent from the diluted carrier gas supply device 22b to carry the atomized droplets via an inflow port into the film-formation chamber 27. The film-formation chamber 27 is a supply pipe made of quartz with an inner diameter of 40 mm in that a susceptor 21 made of quartz, on which an object is to be placed, is arranged. The mist CVD apparatus 19 further includes a heater 28 arranged on a periphery of the film-formation chamber 27, and the film-formation chamber 27 includes an exhaust port 11 to release atomized droplets and gas after the film is formed. The exhaust port 11 is positioned at an opposite side of the inflow port of the film-formation chamber 27. The supply pipe as the film-formation chamber 27 and the susceptor 21 both made of quartz tend to suppress impurities due to materials of the apparatus entering a film to be formed on the object. The term "susceptor" herein includes a holder to support and/or hold an object on which a film is formed.

2. Preparation of Raw-Material Solution

A raw-material solution is prepared by mixing polysilazane in xylene. The volume ratio of polysilazane and xylene was set to be 1:1.

3. Film Formation Preparation

The raw-material solution 24a obtained at 2 the Preparation of the Raw-Material Solution above was set in the container of the mist generator 24. Also, a sapphire substrate as an object 20 on which a film is to be formed was placed on the susceptor 21 in the supply pipe as the film-formation chamber 27. The heater 28 was activated to raise the temperature in the film-formation chamber 27 up to 750° C. The flow-control valve 23a of carrier gas and the flow-control valve 23b of diluted carrier gas were opened to supply a carrier gas from the carrier gas supply device 22a and the diluted carrier gas supply device 22b, which are the source of carrier gas, into the film-formation chamber 27 to replace the atmosphere in the film-formation chamber 27 with the carrier gas. After the atmosphere in the film-formation chamber 27 was replaced with the carrier gas, the flow rate of the carrier gas from the carrier gas supply device 22a was regulated at 10 L/min. and the diluted carrier gas from the diluted carrier gas supply device 22b was regulated at 10 L/min. In this embodiment, nitrogen was used as the carrier gas.

4. Formation of a Film

Figure 2:
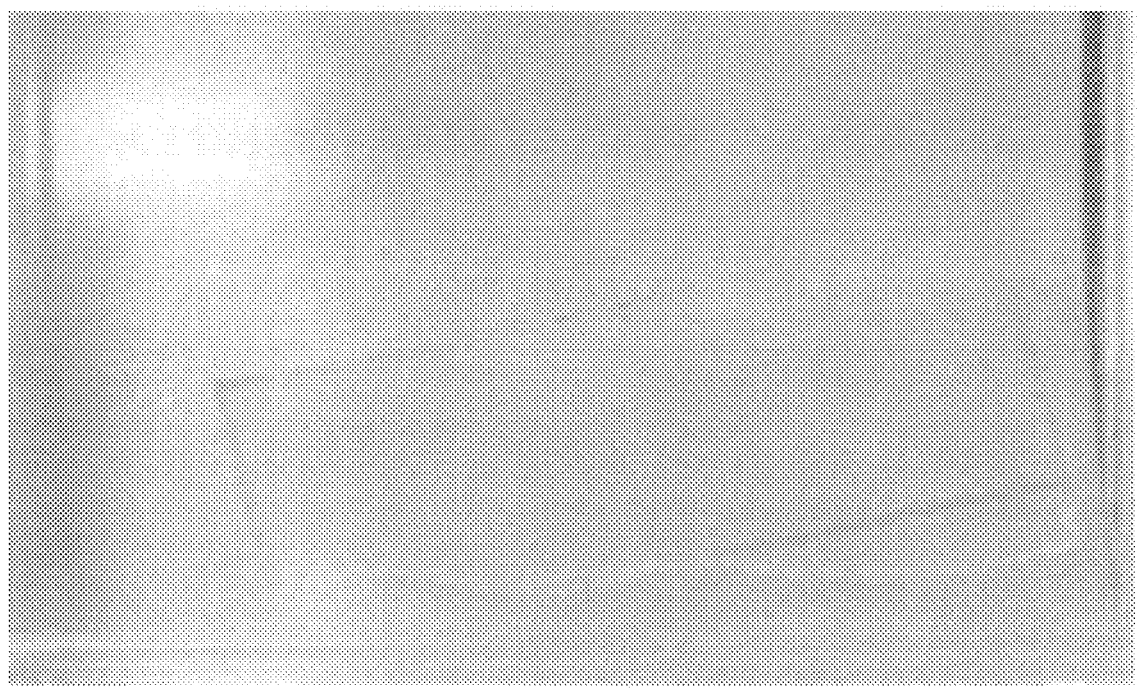
FIG. 2 shows a picture of a film obtained according to an embodiment of a present inventive subject matter.

The ultrasonic transducer 26 was then activated to vibrate at 2.4 MHz, and vibrations were propagated through the water 25a in the vessel to the raw material solution 24a to turn the raw material solution 24a into atomized droplets. The atomized droplets were introduced via the inflow port into the film-formation chamber 27 with the carrier gas, and heated at the temperature of 750° C. inside the film-formation chamber 27 to cause a thermal reaction of the atomized droplets to form a film on the sapphire substrate. This film-formation was conducted under atmospheric pressure, that means without using a device to adjust the atmospheric pressure such as a vacuum system. The film obtained here appeared to be a transparent film of 350 nm in thickness. FIG. 2 shows a picture of the film obtained in this embodiment.

5. Evaluation

The film obtained at 4. was evaluated by use of an energy dispersive X-ray spectrometer (EDS) and an X-ray diffraction (XRD) analysis. The film obtained was found to be a film of $\alpha$-$Si_3N_4$. Also, the film was evaluated by use of a tester and found to be electrically-insulating.

Practical Example 2

Figure 3A:
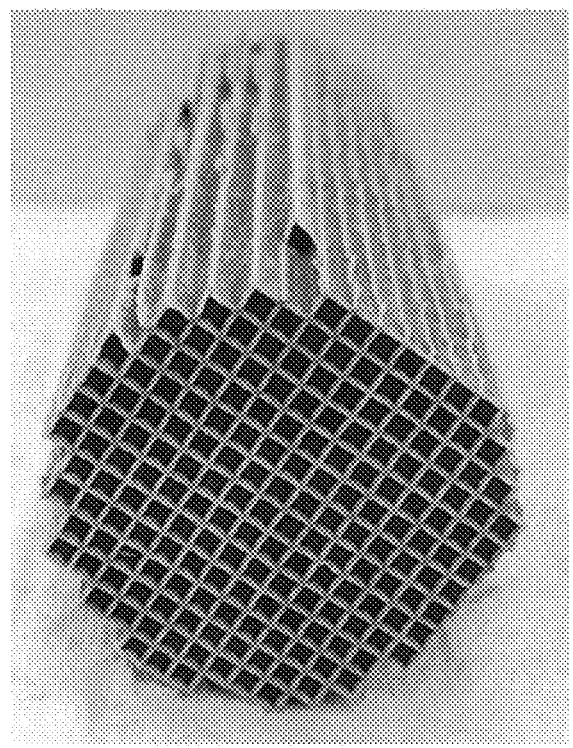
FIG. 3A shows a picture of an object before a film is formed on the object.

A film was obtained by the same conditions as the conditions of the forming the film in Practical Example 1 above except the following four conditions: using a base including a honeycomb structure shown in FIG. 3A as an object 20 instead of using a sapphire substrate; using a raw material solution containing phosphorus, magnesium and aluminum in methanol instead of using a raw-material solution containing nitrogen and silicon in xylene; setting the flow rate of the carrier gas to 5.0 L/min; and without using a diluted carrier gas.

Figure 3B:
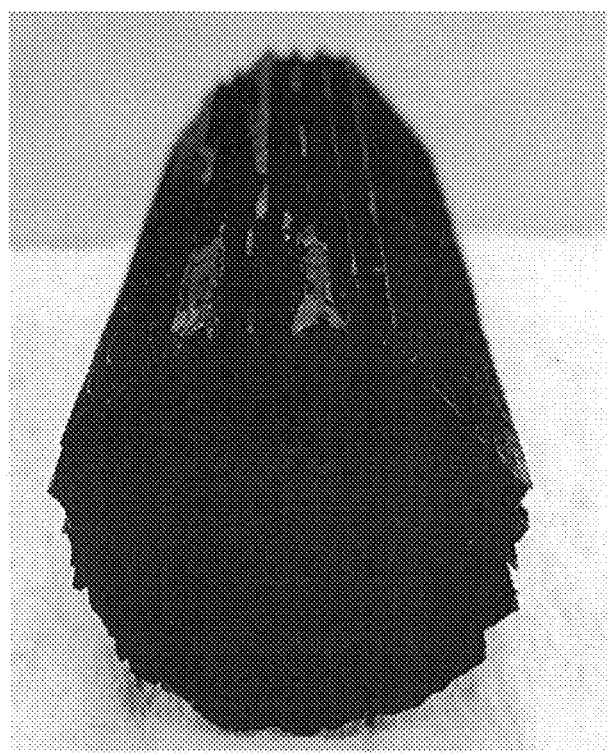
FIG. 3B shows a picture of an object with a film formed on the object.

FIG. 3A shows a picture of the base including the honeycomb structure, showing the base before a film is formed on the base. FIG. 3B shows a picture of the base shown in FIG. 3A, showing a film formed on the base. The film obtained in this embodiment appeared to be a black-colored film uniformly formed even on an uneven surface of the honeycomb structure.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

A non-oxide film according to an embodiment of a present inventive subject matter is able to be used in various devices including electronic parts, devices and appliances semiconductor devices, power devices including inverters, electronic devices, optical devices, power sources and power systems.

REFERENCE NUMBER DESCRIPTION 19 a film-formation apparatus
20 an object on which a film is to be formed
21 a susceptor
22a a carrier gas supply device
22b a diluted carrier gas supply device
23a a flow-control valve of carrier gas
23b a flow-control valve of diluted carrier gas
24 a mist generator
24a a raw material solution
25 a vessel
25a water
26 an ultrasonic transducer
27 a film-formation chamber
28 a heater
29 an exhaust outlet

What is claimed is:

1. A method of forming a phosphide film or a nitride film, comprising:
   turning a raw material solution comprising at least a first chemical element, a second chemical element, and a solvent into atomized droplets, wherein the first chemical element is phosphorus or nitrogen, and the second chemical element is selected from the group consisting of d-block elements, elements of Group 13 of the periodic table and elements of Group 14 of the periodic table;
   supplying an inert gas to the atomized droplets that are floating and comprise at least the first chemical element and the second chemical element to carry the atomized droplets by the inert gas onto an object in a film-formation chamber; and
   causing a reaction of the atomized droplets under the atmosphere of the inert gas in the film-formation chamber to form a phosphide film or a nitride film comprising at least the first chemical element and the second chemical element on the object.

2. The method of claim 1, wherein
   the reaction of the atomized droplets is a thermal reaction of the atomized droplets under the inert gas atmosphere.

3. The method of claim 2, wherein
   the thermal reaction is conducted at a temperature of 500° C. or higher.

4. The method of claim 2, wherein
   the thermal reaction is conducted under the inert gas atmosphere without influence of oxygen.

5. The method of claim 1, wherein
   the first chemical element and the second chemical element in the raw material solution are in a form of a compound.

6. The method of claim 1, wherein
   the second chemical element is a d-block element that is a Period 4 element of the periodic table.

7. The method of claim 1, wherein
   the second chemical element is selected from Group 14 of the periodic table.

8. The method of claim 1, wherein
   the atomic ratio of the first chemical element and the second chemical element in the raw material solution is in a range of 1:2 to 10:1.

9. The method of claim 1, wherein the film is a non-oxide film.

10. The method of claim 1, wherein the film is formed under atmospheric pressure.

11. The method of claim 1, further comprising: filling the film-formation chamber with the inert gas.

12. A method of forming a phosphide film or a nitride film, comprising:
turning a raw material solution comprising at least a first chemical element, a second chemical element, and a solvent into atomized droplets, wherein the first chemical element is phosphorus or nitrogen, and the second chemical element is selected from the group consisting of d-block elements, elements of Group 13 of the periodic table and elements of Group 14 of the periodic table;
supplying a reducing gas to the atomized droplets that are floating and comprise at least the first chemical element and the second chemical element to carry the atomized droplets by the reducing gas onto an object in a film-formation chamber; and
causing a reaction of the atomized droplets under the atmosphere of the reducing gas in the film-formation chamber to form a phosphide film or a nitride film comprising at least the first chemical element and the second chemical element on the object.

13. The method of claim 12, wherein the reaction of the atomized droplets is a thermal reaction of the atomized droplets under the reducing gas atmosphere.

14. The method of claim 13, wherein the thermal reaction is conducted at a temperature of 500° C. or higher.

15. A method of forming a nitride film, comprising:
turning a raw material solution comprising at least a first chemical element, a second chemical element, and a solvent into atomized droplets, wherein the first chemical element is nitrogen, and the second chemical element is selected from the group consisting of d-block elements, elements of Group 13 of the periodic table and elements of Group 14 of the periodic table;
filling a film-formation chamber with an inert gas;
supplying the inert gas to the atomized droplets that are floating and comprise at least the first chemical element and the second chemical element to carry the atomized droplets by the inert gas onto an object in the film-formation chamber; and
causing a reaction of the atomized droplets under the atmosphere of the inert gas in the film-formation chamber to form a nitride film comprising at least nitrogen and the second chemical element on the object.

16. The method of claim 15, wherein the reaction is a thermal reaction conducted under the inert gas atmosphere without influence of oxygen.

17. The method of claim 15, wherein the film is formed under atmospheric pressure.

18. A method of forming a nitride film comprising:
turning a raw material solution comprising at least a first chemical element, a second chemical element, and a solvent into atomized droplets, wherein the first chemical element is nitrogen, and the second chemical element is selected from the group consisting of d-block elements, elements of Group 13 of the periodic table and elements of Group 14 of the periodic table;
supplying a reducing gas to the atomized droplets that are floating and comprise at least nitrogen and the second chemical element to carry the atomized droplets by the reducing gas onto an object in the film-formation chamber; and
causing a reaction of the atomized droplets under the atmosphere of the reducing gas in the film-formation chamber to form a film comprising at least nitrogen and the second chemical element on the object under atmospheric pressure.

19. The method of claim 18, wherein the reaction is a thermal reaction conducted under the reducing gas atmosphere without influence of oxygen.

20. The method of claim 18, further comprising: filling a film-formation chamber with the reducing gas.

* * * * *